United States Patent
Kawamura (10) Patent No.: US 8,872,565 B2
(45) Date of Patent: Oct. 28, 2014

(54) SIGNAL PROCESSING APPARATUS AND SIGNAL PROCESSING METHOD

(71) Applicant: Canon Kabushiki Kaisha, Tokyo (JP)

(72) Inventor: Koji Kawamura, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 13/889,760

(22) Filed: May 8, 2013

(65) Prior Publication Data

US 2013/0335138 A1    Dec. 19, 2013

(30) Foreign Application Priority Data

Jun. 18, 2012   (JP) .................................. 2012-137266

(51) Int. Cl.
 *G06F 1/04*   (2006.01)
 *H03K 5/1252*   (2006.01)

(52) U.S. Cl.
 CPC .................................... *H03K 5/1252* (2013.01)
 USPC ............................ 327/291; 327/293; 327/296

(58) Field of Classification Search
 USPC .................. 327/165, 166, 291–299, 374, 178; 326/93–98; 716/6
 See application file for complete search history.

(56) References Cited

U.S. PATENT DOCUMENTS

| | | | |
|---|---|---|---|
| 6,573,769 B1 * | 6/2003 | Zhang et al. | 327/156 |
| 7,532,989 B1 * | 5/2009 | Torosyan | 702/66 |
| 8,514,116 B2 * | 8/2013 | Hode et al. | 341/143 |
| 2004/0183578 A1 * | 9/2004 | Chong et al. | 327/161 |
| 2006/0091926 A1 * | 5/2006 | Monma et al. | 327/276 |
| 2011/0038400 A1 * | 2/2011 | Ishikawa et al. | 375/219 |

FOREIGN PATENT DOCUMENTS

JP    08-201111 A    8/1996

* cited by examiner

*Primary Examiner* — Brandon S Cole
(74) *Attorney, Agent, or Firm* — Fitzpatrick, Cella, Harper & Scinto

(57) ABSTRACT

Digital signals with higher resolution are generated from dual-phase encode signals indicating phase changes of a position or an angle of a target. A signal processing apparatus for processing dual-phase encode signals indicating changes in position of a target, comprises: a first noise reduction unit configured to remove high frequency noise from each of the dual-phase encode signals before interpolation processing; an interpolating unit configured to apply interpolation processing to the dual-phase encode signals output from the first noise reduction unit to generate dual-phase encode signals with higher resolution; and a second noise reduction unit configured to remove noise from the dual-phase encode signals output from the interpolating unit.

18 Claims, 12 Drawing Sheets

DISTORTION

SIGNAL PROCESSING APPARATUS AND SIGNAL PROCESSING METHOD

BACKGROUND

Description of the Related Art

In general, an optical rotary encoder is popularly used to detect a moving amount, angle, position, and the like of a rotation member of a motor or the like. A rotary encoder of this type irradiates a rotation signal screen provided with a required signal pattern with uniform light from a light-emitting element including a light-emitting diode (LED) or the like from one side. Then, a light-receiving element such as a photodiode or phototransistor receives and detects transmission light which has transmitted through the signal pattern or reflected light from the signal screen. As functional segmentations of the encoder, an incremental type and absolute type are known.

In order to enhance the resolutions of the moving amount, angle, and position to be detected, an interpolation circuit which executes interpolation processing for an encode signal is often used. In general, the interpolation circuit detects an angle value corresponding to a unit of resolution from a phase difference between two encoder input signals of different phases such as a sine wave signal and cosine wave signal, and generates interpolation signals corresponding to the resolution from the detected angle value. Then, a count is made based on the generated interpolation signals, thus realizing position detection with the enhanced angle resolution.

When noise is mixed in encode signals, wrong interpolation signals are generated. Thus, as a measure against noise with respect to encode signals, a noise suppression circuit which uses analog parts such as capacitors, coils, and resistors on a circuit board is known. Also, for example, Japanese Patent Laid-Open No. 08-201111 discloses an arrangement which removes high frequency components from encode signals after analog-to-digital (A/D) conversion via a low pass filter (LPF), and then inputs these signals to an interpolation circuit.

However, encode signals include not only high frequency noise components but also distortion components, phase errors, offset errors, or the like due to causes such as disturbance noise, element noise, and temperature drift. For this reason, the arrangement described in Japanese Patent Laid-Open No. 08-201111 cannot sufficiently remove these errors. When the interpolation processing is applied to encode signals including such errors, interpolation signals including interpolation errors are generated.

SUMMARY OF THE INVENTION

According to an aspect of the present invention, a signal processing apparatus for processing dual-phase encode signals indicating changes in position of a target, comprises: a first noise reduction unit configured to remove high frequency noise from each of the dual-phase encode signals before interpolation processing; an interpolating unit configured to apply interpolation processing to the dual-phase encode signals output from the first noise reduction unit to generate dual-phase encode signals with higher resolution; and a second noise reduction unit configured to remove noise from the dual-phase encode signals output from the interpolating unit.

According to another aspect of the present invention, a signal processing apparatus for processing dual-phase encode signals indicating changes in position of a target, comprises: a first noise reduction unit configured to remove high frequency noise from each of the dual-phase encode signals before interpolation processing; an interpolating unit configured to apply interpolation processing to the dual-phase encode signals output from the first noise reduction unit to generate control signals with higher resolution; and a second noise reduction unit configured to remove noise from the control signals output from the interpolating unit.

The present invention suitably generates high-resolution digital signals from dual-phase encode signals indicating phase changes of a position or angle of a target.

Further features of the present invention will become apparent from the following description of exemplary embodiments (with reference to the attached drawings).

BRIEF DESCRIPTION OF THE DRAWINGS

The accompanying drawings, which are incorporated in and constitute a part of the specification, illustrate embodiments of the invention and, together with the description, serve to explain the principles of the invention.

DESCRIPTION OF THE EMBODIMENTS

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

In one embodiment, an interpolation apparatus for processing dual-phase encode signals indicating phase changes of a position or angle of a target will be exemplified below.

<Prior Technique>

Figure 1:
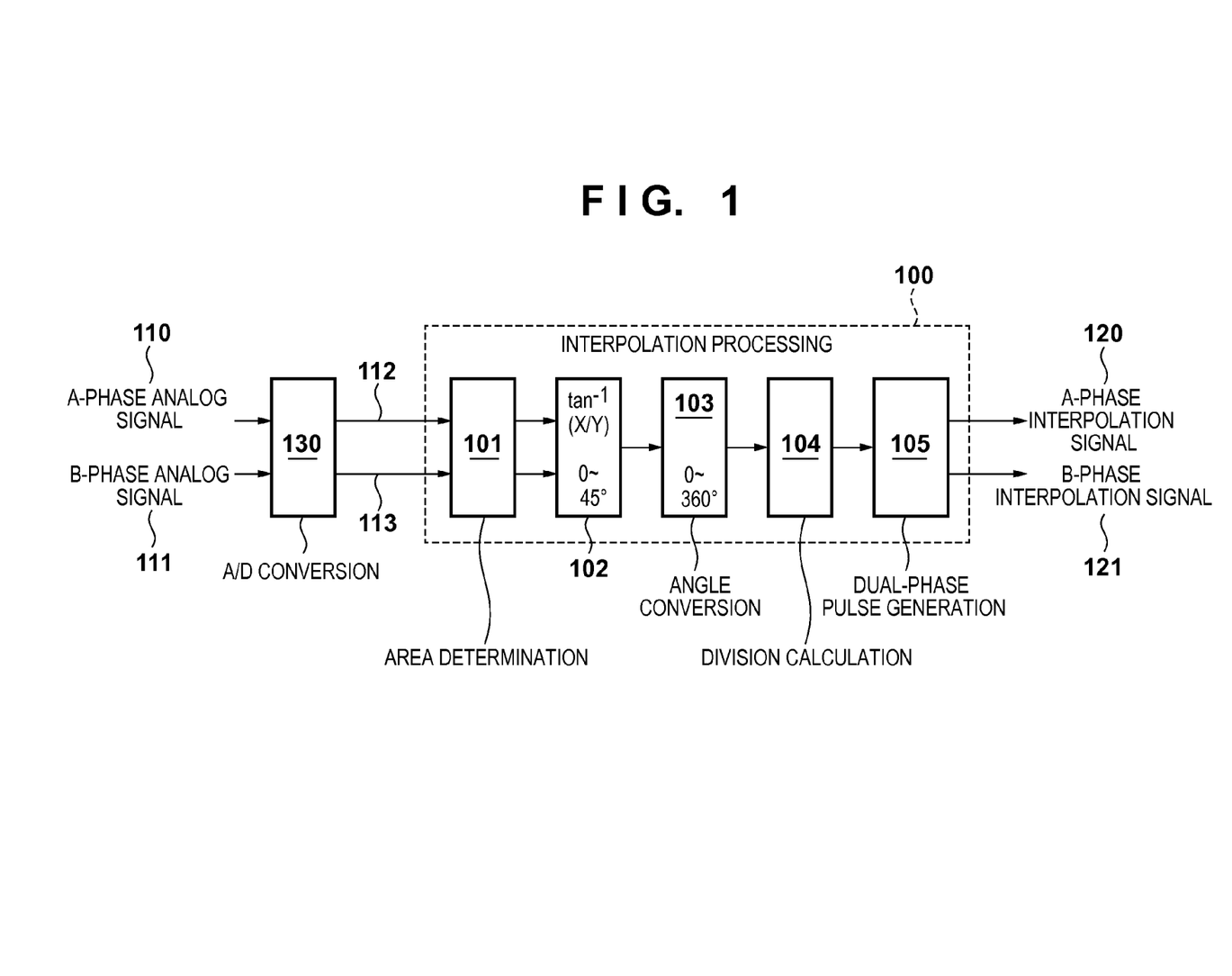
FIG. 1 is a block diagram showing the arrangement of an interpolation circuit for executing interpolation using arctangent calculations.

Interpolation processing for encode signals input from an encoder synchronized with a motor will be described first. Note that an interpolation processing unit 100 will explain interpolation processing for executing interpolation using arctangent calculations below, but interpolation processing based on other methods may be executed.

FIG. 1 is an internal block diagram of the interpolation processing unit 100 which executes interpolation using arctangent calculations. As encode signals, an A-phase analog signal 110 and B-phase analog signal 111 output from an encoder synchronized with a motor are assumed.

An analog-to-digital (A/D) conversion unit 130 converts the A-phase analog signal 110 and B-phase analog signal 111 into a multi-valued A-phase digital signal 112 and multi-valued B-phase digital signal 113. Then, the A-phase digital signal 112 and B-phase digital signal 113 are input to the interpolation processing unit 100.

The interpolation processing unit 100 includes an area determination unit 101, arctangent calculation unit 102, angle conversion unit 103, division calculation unit 104, and dual-phase pulse generation unit 105.

The area determination unit 101 determines to which area (phase range) of eight areas (areas 0 to 7) divided in 45° units the current position (phase) of the motor belongs. More specifically, the area determination unit 101 extracts amplitude values of the A-phase digital signal 112 and B-phase digital signal 113. Then, the area determination unit 101 compares the extracted amplitude values to determine to which of the following areas (areas 0 to 7) the current position belongs.

Area 0 (not less than 0° and less than 45°)
Area 1 (not less than 45° and less than 90°)
Area 2 (not less than 90° and less than 135°)
Area 3 (not less than 135° and less than 180°)
Area 4 (not less than 180° and less than 225°)
Area 5 (not less than 225° and less than 270°)
Area 6 (not less than 270° and less than 315°)
Area 7 (not less than 315° and less than 360°)

The arctangent calculation unit 102 calculates an arctangent ($\tan^{-1}$) value for each area to which the current position belongs. That is, the arctangent calculation unit 102 calculates a relative angle value in each area (relative angle deriving unit). Then, the angle conversion unit 103 calculates a current angle value (absolute angle value) based on the area to which the current position belongs and the calculated arctangent value (angle value deriving unit). More specifically, the angle conversion unit 103 calculates the current angle value of the motor by the following calculations according to the area to which the current position belongs.

Area 0: $0° + \tan^{-1}(V_B/V_A)$
Area 1: $90° - \tan^{-1}(V_A/V_B)$
Area 2: $90° + \tan^{-1}(V_A/V_B)$
Area 3: $180° - \tan^{-1}(V_B/V_A)$
Area 4: $180° + \tan^{-1}(V_B/V_A)$
Area 5: $270° - \tan^{-1}(V_A/V_B)$
Area 6: $270° + \tan^{-1}(V_A/V_B)$
Area 7: $360° - \tan^{-1}(V_B/V_A)$ where $V_A$ is a potential difference with respect to a reference potential (zero point) of the A-phase digital signal 112. Also, $V_B$ is a potential difference with respect to a reference potential (zero point) of the B-phase digital signal 113.

The division calculation unit 104 calculates a resolution from the pre-set number of divisions. For example, when 16-divided interpolation is to be executed, the division calculation unit 104 calculates:

$$360°/16 = 22.5°$$

and passes the calculated resolution (22.5° in this case) to the dual-phase pulse generation unit 105.

The dual-phase pulse generation unit 105 generates interpolation for each calculated resolution (dual-phase signal generation unit). More specifically, the dual-phase pulse generation unit 105 generates dual-phase interpolation signals in accordance with the resolution from the division calculation unit 104 and the current angle value from the angle conversion unit 103. Thus, an A-phase interpolation signal 120 and B-phase interpolation signal 121 (high-resolution digital signals) having an angle resolution higher than the A-phase digital signal 112 and B-phase digital signal 113 are generated.

Figure 2:
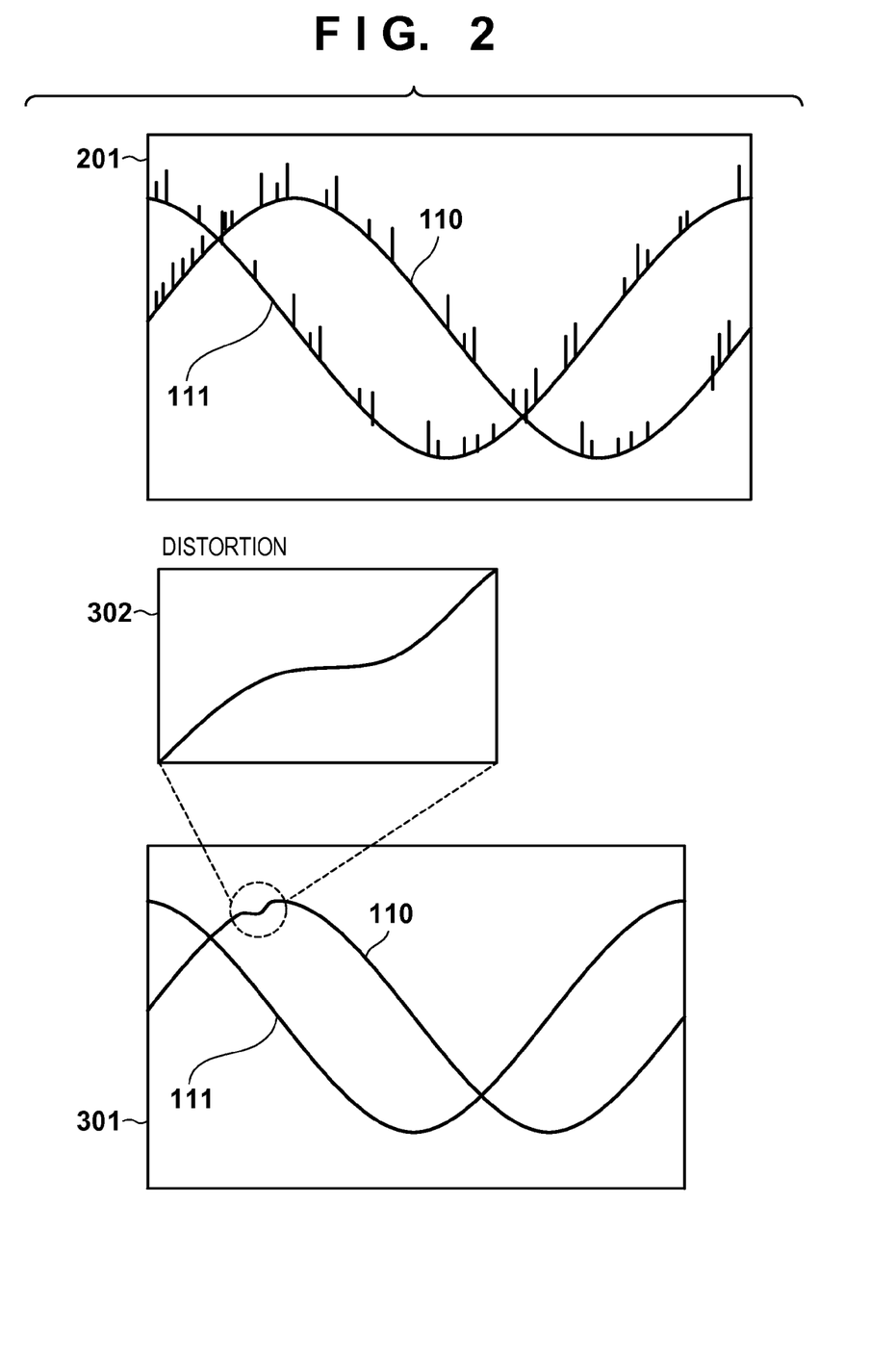
FIG. 2 exemplarily shows noise/distortion included in encode signals.

FIG. 2 exemplarily shows noise/distortion included in encode signals. When the A-phase analog signal 110 or B-phase analog signal 111 as an input from the encoder includes noise, a waveform disturbed by noise like a signal waveform 201 is formed. This noise remains even after that signal is converted into a digital signal by the A/D conversion unit 130. In this case, the A-phase digital signal 112 including noise and B-phase digital signal 113 are input to the interpolation processing unit 100. A signal waveform 301 exemplarily shows the A-phase analog signal 110, which is partially distorted. A signal waveform 302 is an enlarged view of this distorted portion.

Figure 3:
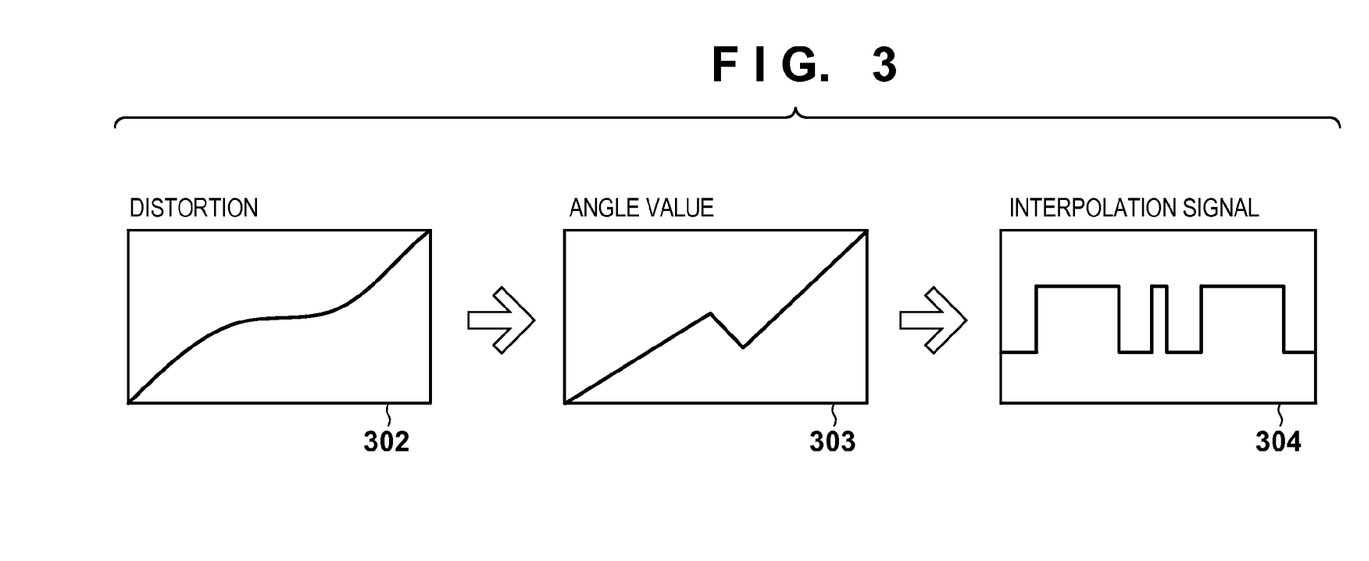
FIG. 3 exemplarily shows generation of an interpolation error due to a distortion.

FIG. 3 exemplarily shows generation of an interpolation error due to a distortion included in encode signals. When an angle value is derived by the angle conversion unit 103 with respect to an ideal sine wave, it is derived as a triangular wave, an angle value of which linearly changes between 0° and 360°.

However, when the angle conversion unit 103 derives an angle value for the distorted encode signal like the signal waveform 302, an irregular signal is likely to be generated. That is, due to a decrease in amplitude value (absolute value from the zero point) at the distorted portion, a gap at which an angle temporarily returns is unwantedly generated, as shown in a graph 303. When processing of the dual-phase pulse generation unit 105 is executed while such gap is generated, a change point is undesirably generated at a position where such point should not be formed. For example, a thin pulse (interpolation error) shown in a signal waveform 304 is generated.

<Apparatus Arrangement>

Figure 4:
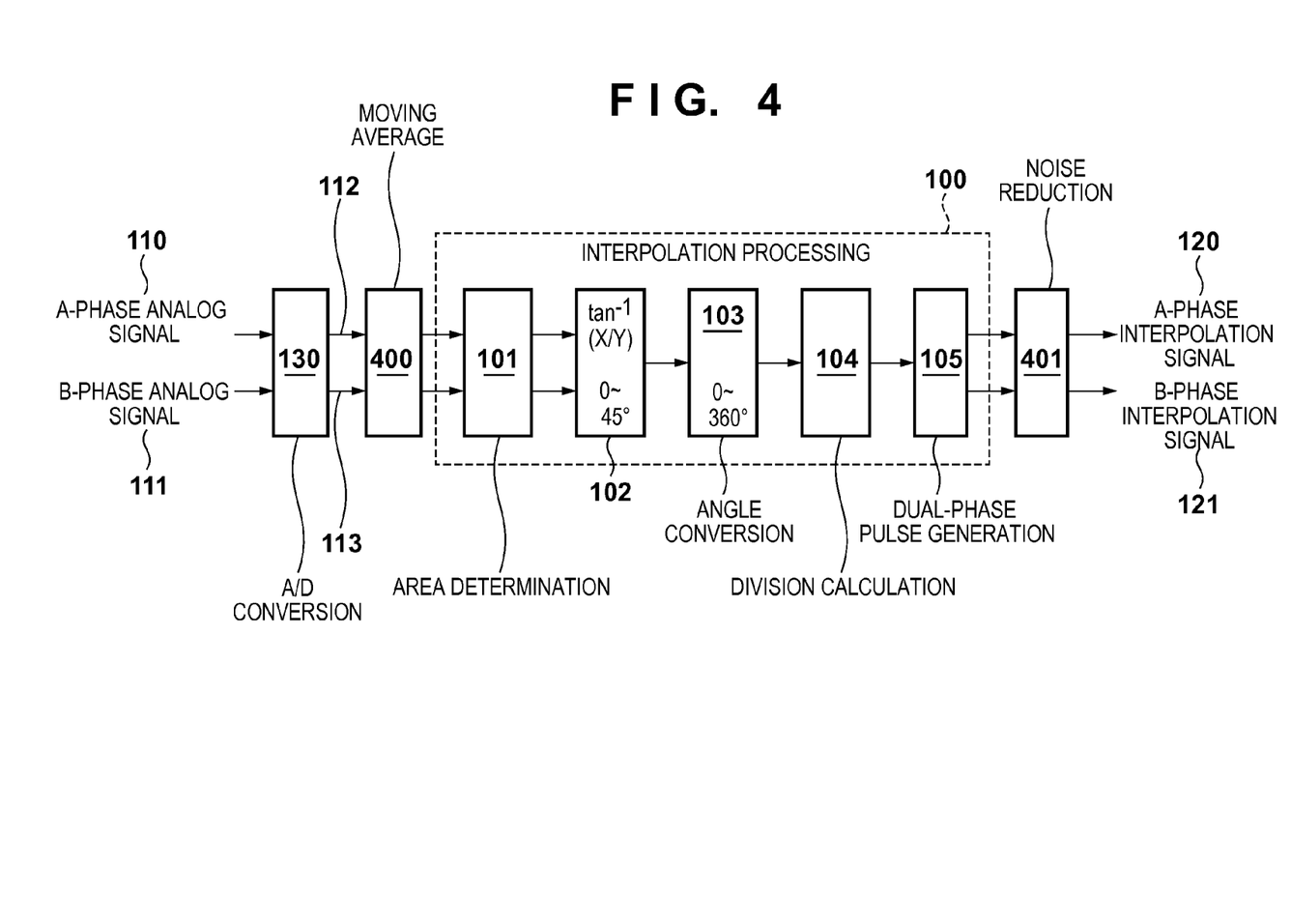
FIG. 4 is a block diagram showing the arrangement of an interpolation apparatus in accordance with one embodiment.

FIG. 4 is a block diagram showing the arrangement of an interpolation apparatus in accordance with one embodiment. More specifically, a moving average unit 400 as a pre-noise reduction unit is arranged before the aforementioned interpolation processing unit 100, and a noise reduction unit 401 as a post-noise reduction unit is arranged after the interpolation processing unit 100.

Figure 5:
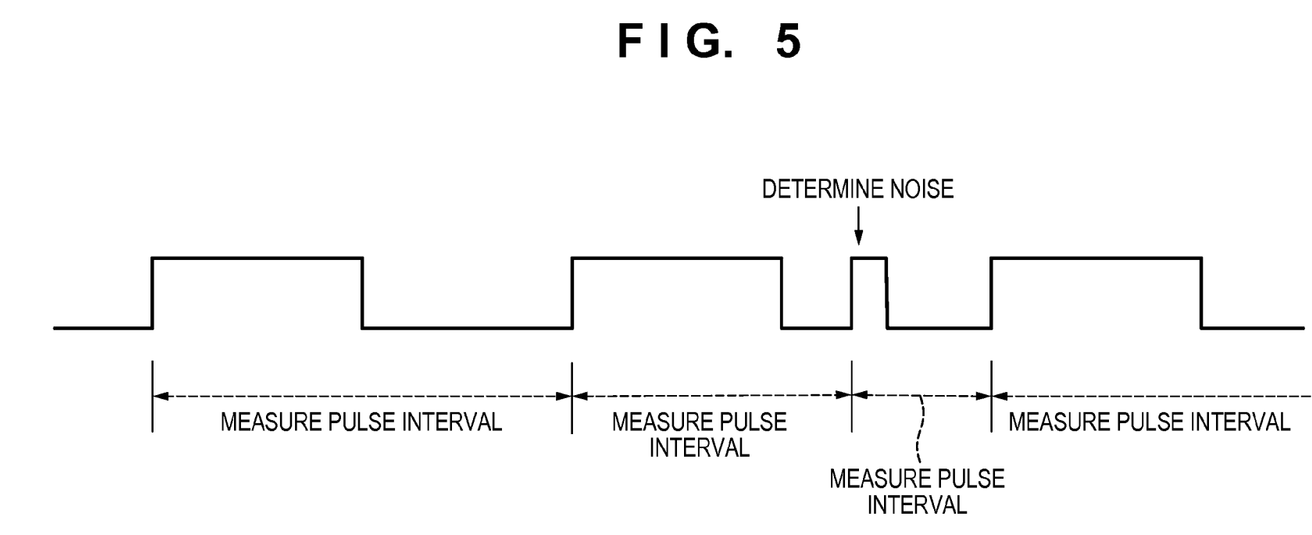
FIG. 5 is a view showing noise reduction of the interpolation apparatus in accordance with one embodiment.

FIG. 5 exemplarily shows noise reduction of the interpolation apparatus in accordance with one embodiment. The moving average unit 400 in the former stage is configured by a moving average circuit, and removes high frequency noise components of those included in the A-phase digital signal 112 and B-phase digital signal 113 as inputs from the A/D conversion unit 130. The high frequency noise components include pulse waves, harmonic waves, and the like. The noise reduction unit 401 in the latter stage removes low frequency noise components which cannot be removed by the moving average unit 400 in the former stage, and interpolation errors caused by distortions of encode signals.

As will be described in detail later, the noise reduction unit 401 in the latter stage always monitors pulse intervals of a pulse train generated by the dual-phase pulse generation unit 105. Then, the noise reduction unit 401 distinguishes a normal pulse and interpolation error (and low frequency noise) from each other. Then, the noise reduction unit 401 is a circuit which deletes only a pulse determined as an interpolation error (and low frequency noise).

That is, since pulse intervals never abruptly change in terms of the characteristics of the motor, when a pulse having an interval apparently different from a pulse interval of a preceding pulse appears, that pulse is determined as an interpolation error (and low frequency noise).

<Operation of Apparatus>

Figure 6:
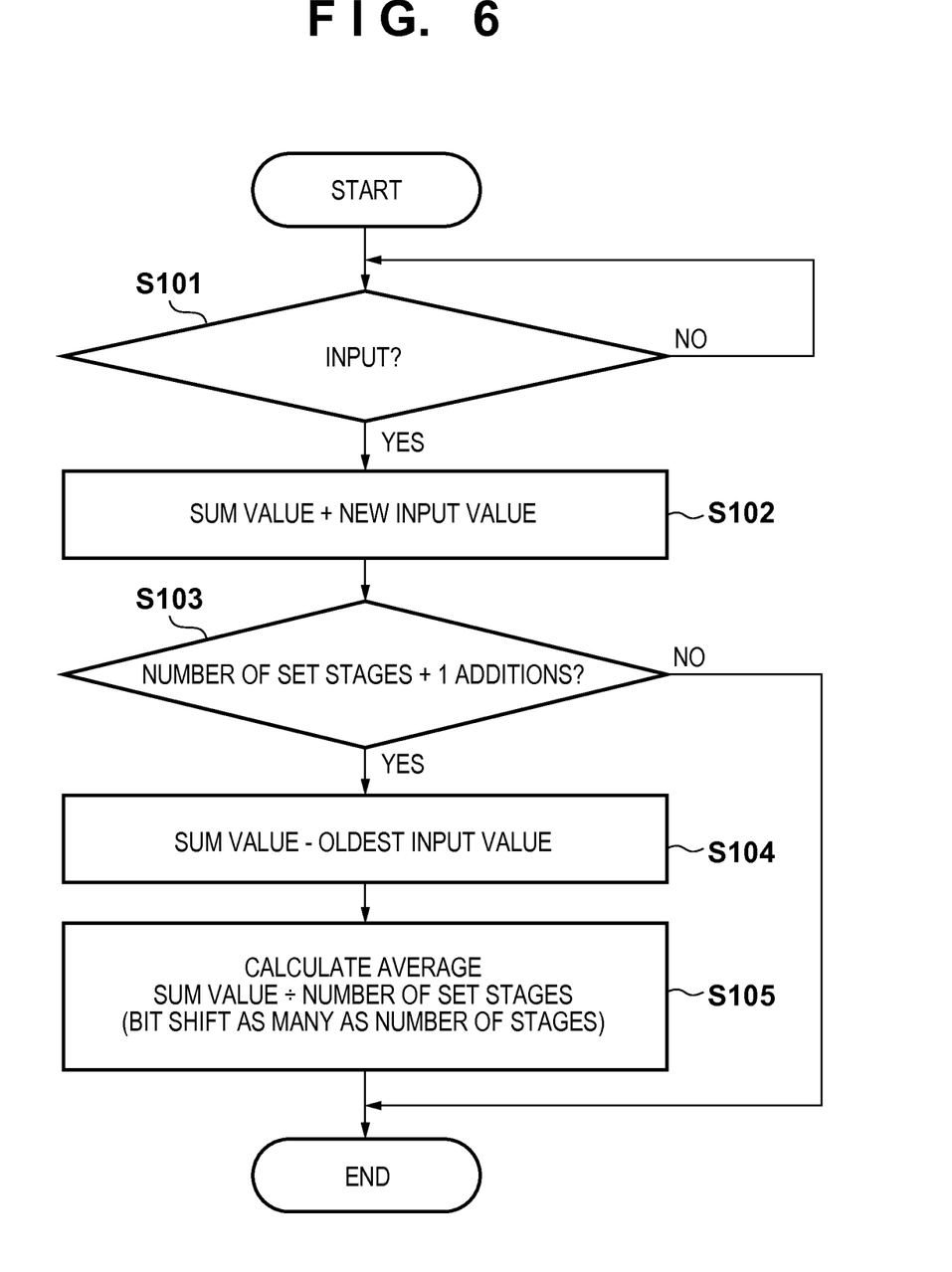
FIG. 6 is a flowchart of moving average processing.

FIG. 6 is a flowchart of moving average processing by the moving average unit 400. This processing is executed respectively for the A-phase digital signal 112 and B-phase digital signal 113, which are converted by the A/D conversion unit 130 into multi-valued digital signals.

In step S101, the moving average unit 400 determines the presence/absence of input signals. If the A-phase digital signal 112 and B-phase digital signal 113 are input, the process advances to step S102; otherwise, the process returns to step S101.

In step S102, the moving average unit 400 calculates sums (SUM values) of values of the input signals. In this case, every time the A-phase digital signal 112 and B-phase digital signal 113 are newly input, the values of the input signals are sequentially added.

The moving average unit 400 judges in step S103 whether or not "the number (N) of set stages"+1" additions have been made for the SUM values. The number (N) of set stages is set to fall within a range from, for example, 2 to 256 (powers of 2). However, the number of set stages is not limited to the power of 2, and an arbitrary number N of stages can be set. If the moving average unit 400 judges that "N+1" additions have been made, the process advances to step S104; otherwise, the process ends.

In step S104, the moving average unit 400 subtracts the values of the oldest input signals included in the SUM values from the SUM values. By subtracting the values of the oldest input signals from the SUM values, the SUM values indicate "sums of the values of input signals as many as the number of set stages at the current timing".

In step S105, the moving average unit 400 calculates averages based on the SUM values and the number of set stages. That is, the moving average unit 400 calculates average values by dividing the SUM values by the number of stages. When the number of stages is set using the power of 2, divisions by means of bit shift may be done. Of course, the division method is not particularly limited, and divisions using the floating decimal point or those using a table may be made. After the average values are calculated in step S105, the processing ends.

Time series of average values generated in this way are used as moving average signals. That is, the moving average signals are input to the interpolation processing unit 100. The moving average unit 400 efficiently removes high frequency noise components.

Figure 7:
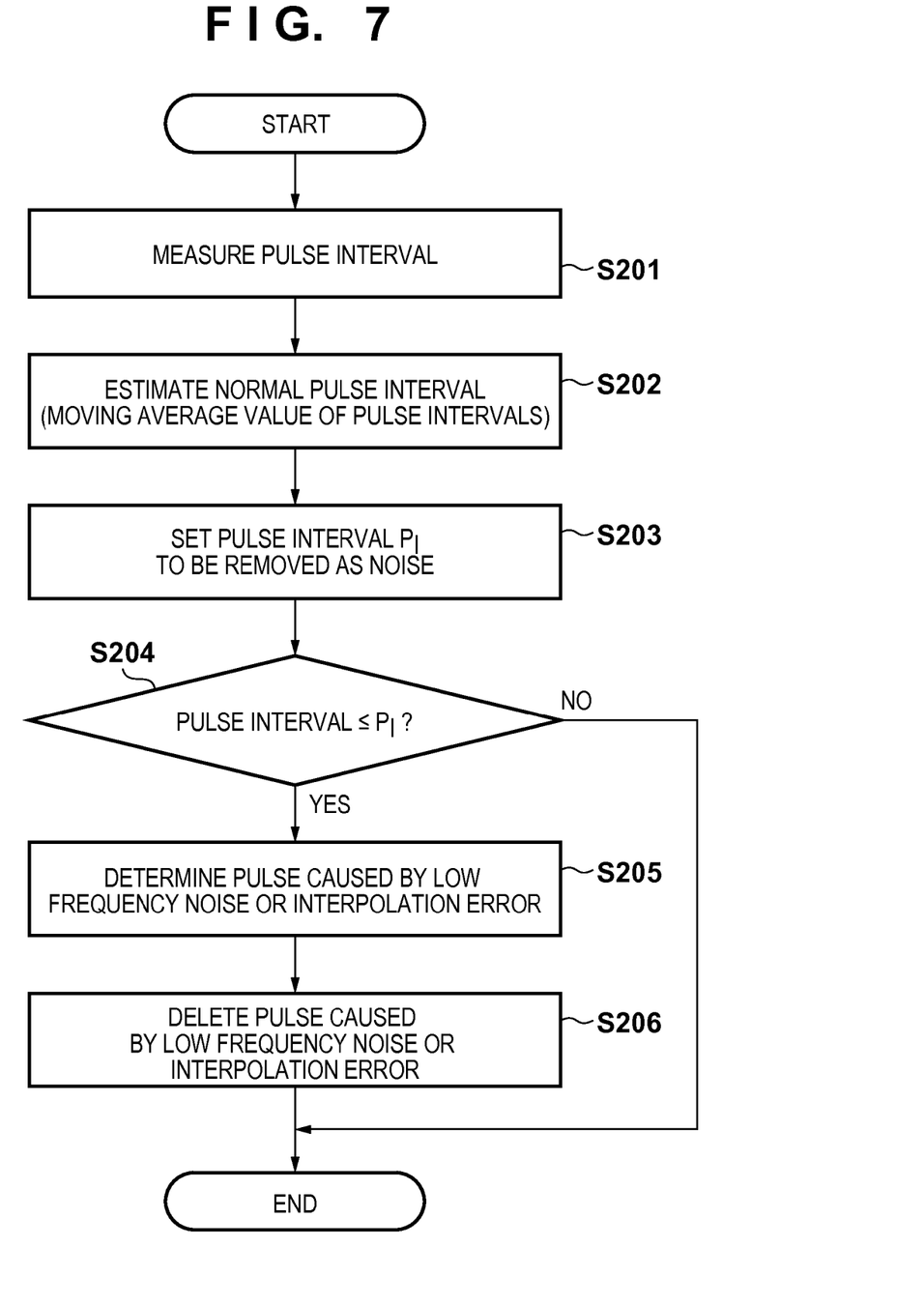
FIG. 7 is a flowchart of noise reduction processing.

FIG. 7 is a flowchart of noise reduction processing by the noise reduction unit 401. This processing is executed respectively for the A-phase interpolation signal and B-phase interpolation signal generated by the dual-phase pulse generation unit 105.

In step S201, the noise reduction unit 401 decides a pulse interval of neighboring pulses included in each interpolation signal generated by the dual-phase pulse generation unit 105. A measurement method includes a count method using clocks, and time measurement using a timer or the like.

In step S202, the noise reduction unit 401 estimates a normal pulse interval. In this embodiment, the noise reduction unit 401 estimates a normal pulse interval based on an average value of previously measured M pulse interval, that is, a moving average value of M stages. That is, an estimated value of the normal pulse interval changes along with an elapse of time. For example, when the number M of stages is 8, a sum total of previously measured 8 pulse intervals is divided by 8 to calculate an average value, and this average value is used as a normal pulse interval. Note that the number M of stages can be arbitrarily set.

In step S203, the noise reduction unit 401 sets a noise pulse interval ("$P_I$") as a pulse interval of a pulse to be removed as noise. The noise pulse interval $P_I$ can be set as, for example, a ratio to the normal pulse interval estimated in step S202. For example, when a pulse having a pulse interval of not more than 12.5% of the normal pulse interval estimated in step S202 is to be removed, a value of 12.5% of the normal pulse interval is set. However, this ratio can also be arbitrarily set. Note that since the estimated value of the normal pulse interval changes along with an elapse of time, as described above, the noise pulse interval $P_I$ also changes along with an elapse of time.

In step S204, the noise reduction unit 401 compares pulse intervals. That is, the noise reduction unit 401 compares the pulse interval measured in step S201 with the noise pulse interval $P_I$ set in step S203. If the pulse interval is not more than $P_I$ (not more than a predetermined interval), the process advances to step S205; otherwise, the processing ends.

In step S205, the noise reduction unit 401 determines that the detected pulse is an interpolation error (and low frequency noise). Then, in step S206, the noise reduction unit 401 deletes the detected pulse (noise reduction unit). The pulse is deleted by executing, for example, processing for inhibiting a signal level from changing. That is, for a pulse which changes from L level to H level, processing for maintaining L level is executed to delete that pulse. On the other hand, for a pulse which changes from H level to L level, processing for maintaining H level is executed to delete that pulse.

That is, since the inputs to the interpolation processing unit 100 are moving average signals, and it is guaranteed so that they do not include abrupt pulse intervals, a pulse not more than the noise pulse interval $P_I$ can be determined as an interpolation error (and low frequency noise). In this manner, by deleting pulses not more than the noise pulse interval $P_I$, interpolation errors (and low frequency noise) can be efficiently removed.

As described above, according to the interpolation apparatus in accordance with one embodiment, since the moving average unit 400 is arranged before the interpolation processing unit 100 and the noise reduction unit 401 based on pulse intervals is arranged after the interpolation processing unit 100, interpolation errors can be efficiently removed. Also, since a large-scale noise suppression circuit need not be arranged on a circuit broad, a cost reduction effect of the overall apparatus can be provided.

Furthermore, as described above, the noise reduction unit 401 dynamically sets the noise pulse interval $P_I$ based on the moving average of pulse intervals of preceding pulses. For this reason, when rotations of the motor are not constant, that is, even when the motor is accelerating or decelerating, noise pulses can be suitably determined and deleted.

Figure 8:
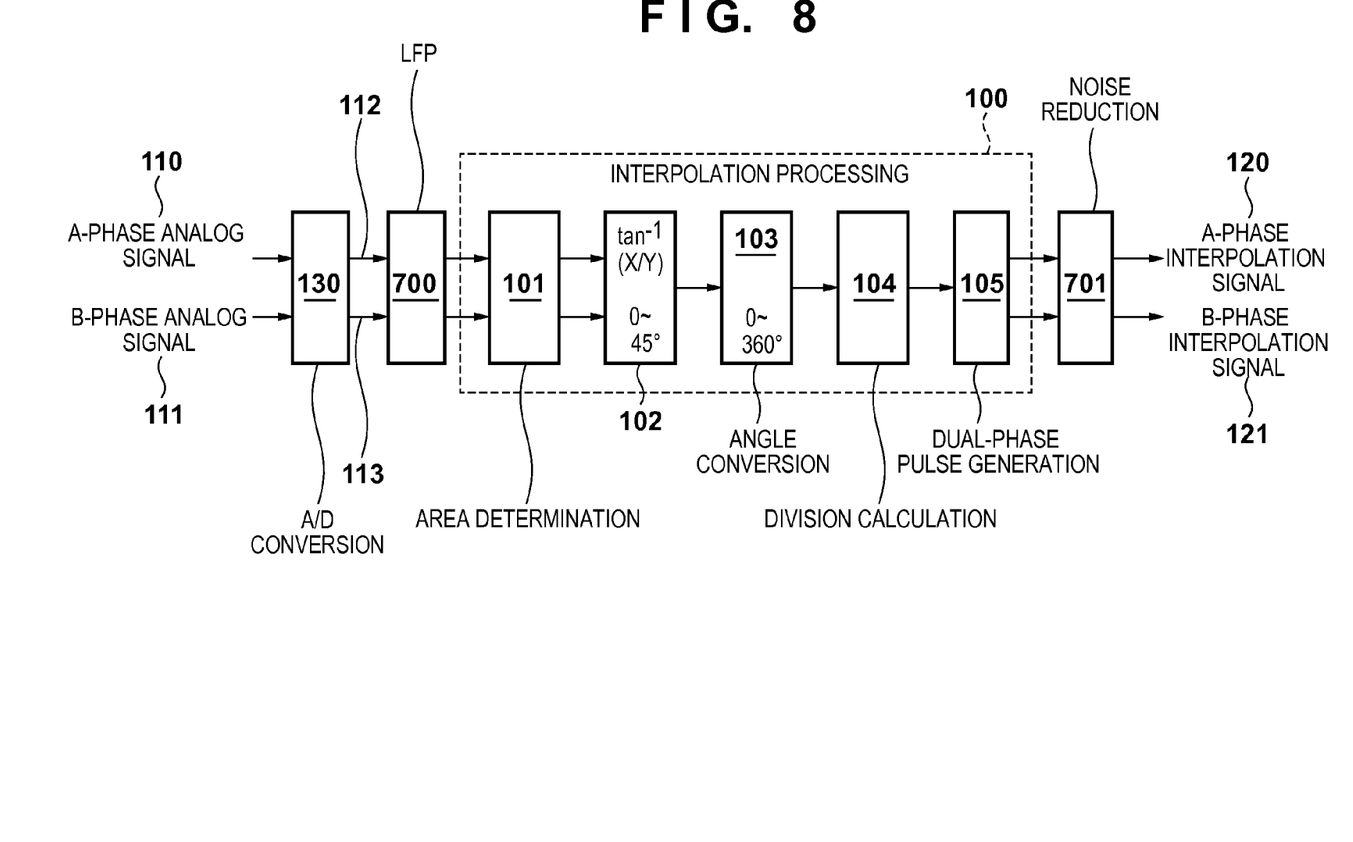
FIG. 8 is a block diagram showing the arrangement of an interpolation apparatus in accordance with one embodiment.

In another embodiment, an arrangement in which an LPF (Low Pass Filter) unit 700 is arranged before an interpolation processing unit 100, and a noise reduction unit 701 is arranged after the interpolation processing unit 100 will be described below.

<Apparatus Arrangement>

FIG. 8 is a block diagram showing the arrangement of an interpolation apparatus in accordance with one embodiment. The interpolation apparatus in accordance with one embodiment has an arrangement in which an LPF (Low Pass Filter) unit 700 serving as a pre-noise reduction unit is arranged before an interpolation processing unit 100, and a noise reduction unit 701 serving as a post-noise reduction unit is arranged after the interpolation processing unit 100. Since the interpolation processing unit 100 is the same as the aforementioned embodiment, a description thereof will not be repeated.

Figure 9:
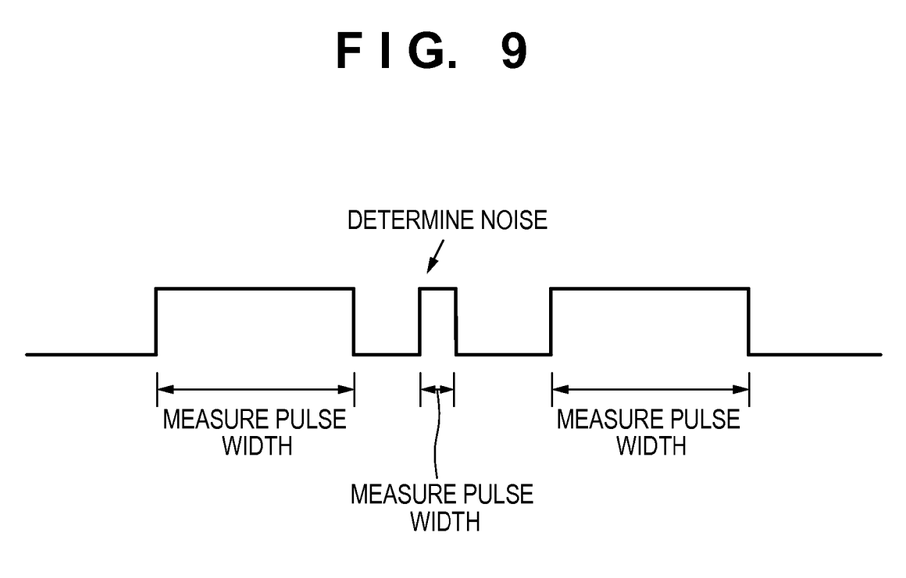
FIG. 9 is a view showing noise reduction of the interpolation apparatus in accordance with one embodiment.

FIG. 9 exemplarily shows noise reduction of the interpolation apparatus in accordance with one embodiment.

The LPF (Low Pass Filter) unit 700 is configured by a circuit which executes low pass filter processing set with a predetermined cutoff frequency, and removes high frequency components of noise components included in an A-phase digital signal 112 and B-phase digital signal 113 as inputs from an A/D conversion unit 130.

The noise reduction unit 701 removes low frequency noise components, which cannot be removed by the LPF (Low Pass Filter) unit 700 and interpolation errors caused by distortions of encode signals.

As will be described in detail later, the noise reduction unit 701 in the latter stage is a circuit which discriminately judges a pulse not more than a predetermined pulse width as an interpolation error (and low frequency noise), and removes the interpolation error (and low frequency noise).

<Operation of Apparatus>

Figure 10:
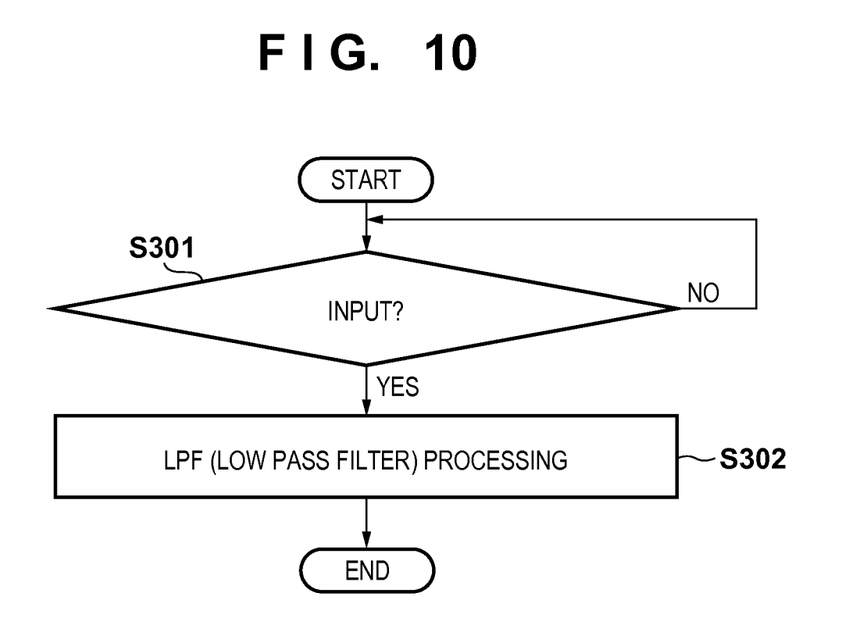
FIG. 10 is a flowchart of LPF processing.

FIG. 10 is a flowchart of LPF processing by the LPF (Low Pass Filter) unit 700. This processing is executed respectively for the A-phase digital signal 112 and B-phase digital signal 113, which are converted by the A/D conversion unit 130 into multi-valued digital signals.

In step S301, the LPF unit 700 determines the presence/absence of input signals. If the A-phase digital signal 112 and B-phase digital signal 113 are input, the process advances to step S302; otherwise, the process returns to step S301.

In step S302, the LPF unit 700 executes LPF (Low Pass Filter) processing. In this case, the LPF unit 700 applies digital LPF (Low Pass Filter) processing respectively for the A-phase digital signal 112 and B-phase digital signal 113. Since a general arrangement of the LPF (Low Pass Filter) is used, a description thereof will not be given. Upon completion of the LPF (Low Pass Filter) processing in step S302, this processing ends.

In this manner, high frequency components of noise components included in the A-phase digital signal 112 and B-phase digital signal 113 are removed.

Figure 11:
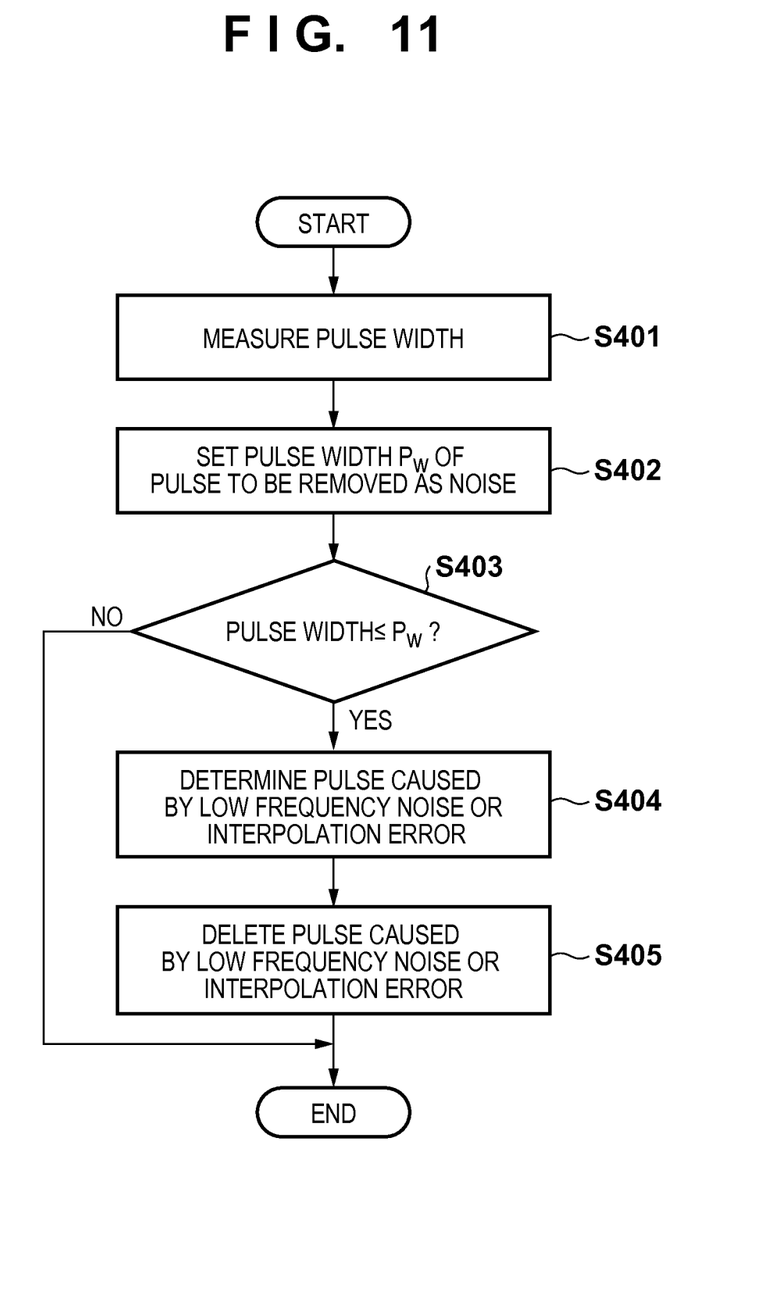
FIG. 11 is a flowchart of noise reduction processing.

FIG. 11 is a flowchart of noise reduction processing by the noise reduction unit 701. This processing is executed respectively for an A-phase interpolation signal and B-phase interpolation signal generated by a dual-phase pulse generation unit 105.

In step S401, the noise reduction unit 701 measures pulse widths of respective pulses included in each interpolation signal generated by the dual-phase pulse generation unit 105. More specifically, the noise reduction unit 701 measures an interval from a change point to the next change point of each interpolation signal. The measurement method includes a count method using clocks, and time measurement using a timer or the like.

In step S402, the noise reduction unit 701 sets a noise pulse width ("$P_W$") as a pulse width of a pulse to be removed as noise. In this case, assume that the noise pulse width $P_W$ of a time width related to the cutoff frequency of the LPF unit 700 is set. However, PW assumes a fixed value which can be arbitrarily set. Note that the noise pulse width $P_W$ may be set prior to step S401.

In step S403, the noise reduction unit 701 compares pulse widths. That is, the noise reduction unit 701 compares the pulse width measured in step S401 with the noise pulse width $P_W$ set in step S402. If the pulse width is not more than $P_W$ (not more than a predetermined width), the process advances to step S404; otherwise, the processing ends.

In step S404, the noise reduction unit 701 determines that the detected pulse is generated due to an interpolation error (and low frequency noise). Then, in step S405, the noise reduction unit 701 deletes the detected pulse (pulse removing unit). The pulse is deleted by executing, for example, processing for inhibiting a signal level from changing. That is, for a pulse which changes from L level to H level, processing for maintaining L level is executed to delete that pulse. On the other hand, for a pulse which changes from H level to L level, processing for maintaining H level is executed to delete that pulse.

In this way, by deleting pulses not more than the noise pulse interval $P_W$, interpolation errors (and low frequency noise) can be efficiently removed.

As described above, according to the interpolation apparatus in accordance with one embodiment, the LPF (Low Pass Filter) unit 700 is arranged before the interpolation processing unit 100, and the noise reduction unit 701 based on a pulse width is arranged after the interpolation processing unit 100. With this arrangement, noise can be removed by a simpler arrangement.

Figure 12:
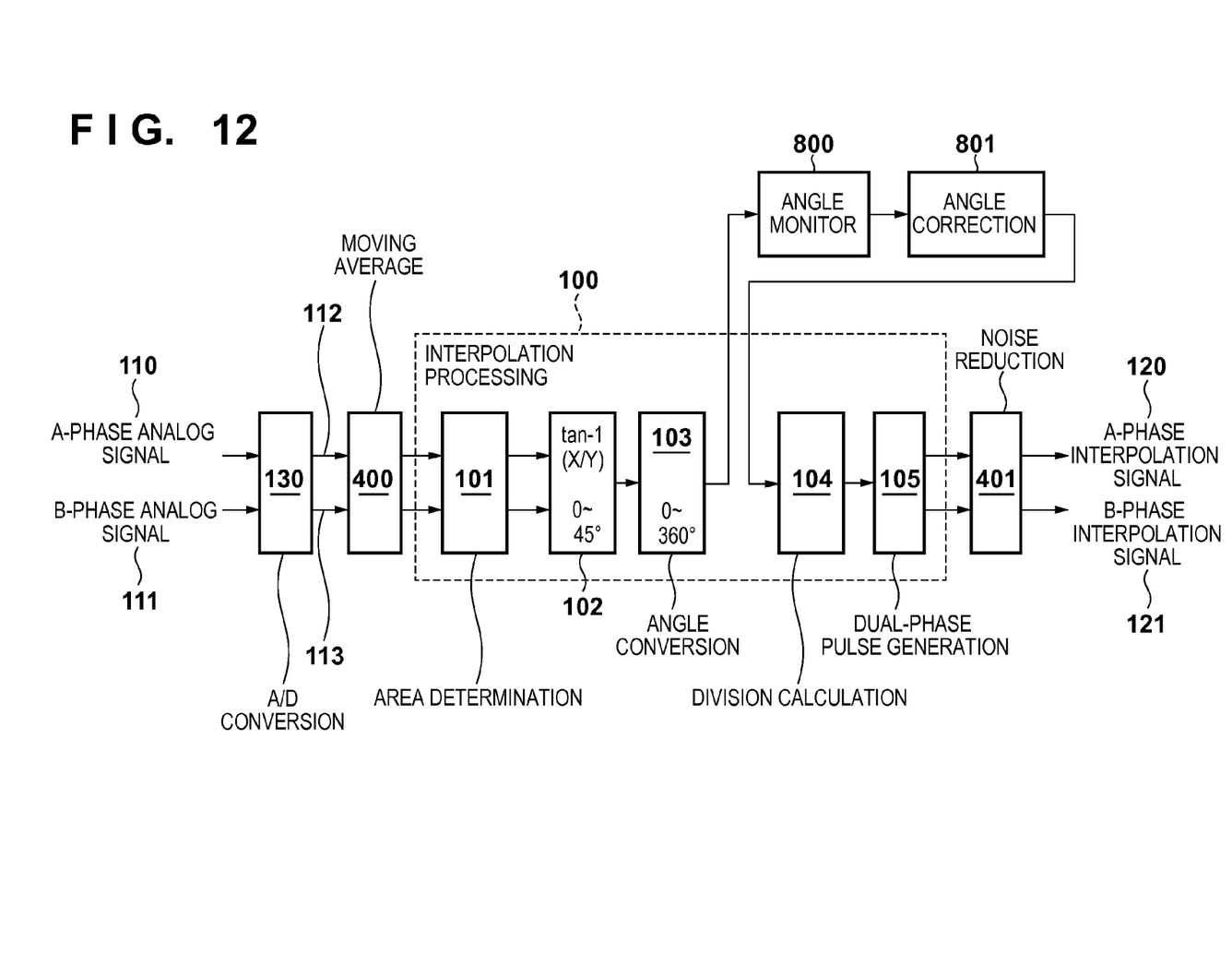
FIG. 12 is a block diagram showing the arrangement of an interpolation apparatus in accordance with one embodiment.

In still another embodiment, an example in which an interpolation processing unit 100 monitors an angle value obtained by angle conversion, and corrects the angle value having a steep angle gap will be described below.

<Apparatus Arrangement>

FIG. 12 is a block diagram showing the arrangement of an interpolation apparatus in accordance with one embodiment. The interpolation apparatus in accordance with one embodiment has an arrangement in which an angle monitor unit 800 and angle correction unit 801 are arranged between an angle conversion unit 103 and division calculation unit 104 in an interpolation processing unit 100. Note that the interpolation processing unit 100, a moving average unit 400, and a noise reduction unit 401 are the same as those in the aforementioned embodiment, and a description thereof will not be repeated.

The angle monitor unit 800 detects a gap of an angle value generated by the angle conversion unit 103 due to an error caused by a distortion of an encode signal (for example, a gap shown in the graph 303). More specifically, the angle monitor unit 800 always monitors an angle value converted by the angle conversion unit 103, and detects a change amount of that angle value.

The angle correction unit 801 corrects the angle value for which a gap is detected by the angle monitor unit 800. More specifically, the angle correction unit 801 corrects the angle value for which the gap is detected, to an angle value obtained by adding a change amount which is the same as that of a (preceding) angle value ahead of one value. This is because since an abrupt angle change does not take place in terms of characteristics of a motor, when a gap of an angle value is detected, it can be judged that the gap is caused by an error resulting from a distortion of an encode signal.

Since the angle value corrected in this way is passed to the division calculation unit 104, for example, even when a gap of an angle value as shown in the graph 303 is generated, it can be prevented from being transferred to latter stages of interpolation processing. Thus, a dual-phase pulse generation unit 105 can be prevented from generating a thin pulse (interpolation error) shown in the graph 304.

Figure 13:
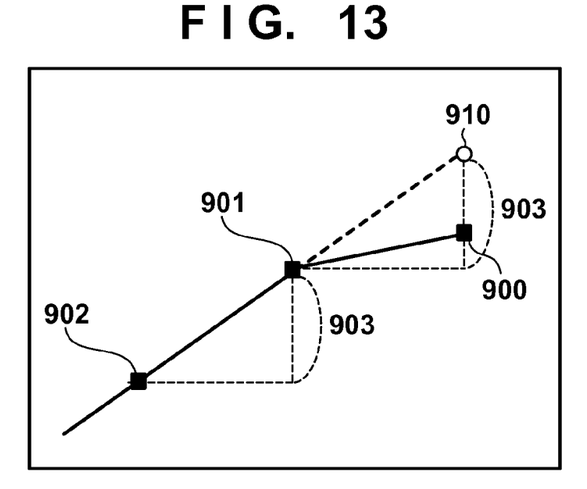
FIG. 13 is a view showing angle value correction of the interpolation apparatus in accordance with one embodiment.

FIG. 13 exemplarily shows angle value correction of the interpolation apparatus in accordance with one embodiment. Of angle values obtained by the angle conversion unit 103, an angle value 900 is a (latest) angle value of interest. An angle value 901 is an angle value ahead of the angle value 900, and an angle value 902 is an angle value ahead of the angle value

901. A change amount 903 indicates a change amount of the angle value, and is always monitored by the angle monitor unit 800.

For example, as can be seen from FIG. 13, when the current angle value is the angle value 900, a change amount is smaller than the change amount 903 of the immediately preceding angle value. Hence, this angle value is detected as an NG value (caused by an interpolation error), and is corrected. An angle value 910 indicates that which is corrected by the angle correction unit 801. As the correction method, the same change amount as the immediately preceding change amount 903 (that is, a difference between the angle values 902 and 901) is applied to the immediately preceding angle value (that is, the angle value 902) to obtain the corrected angle value 910. Note that one or more change amounts (angle changes) of one or more preceding angle values may be applied.

<Operation of Apparatus>

Figure 14:
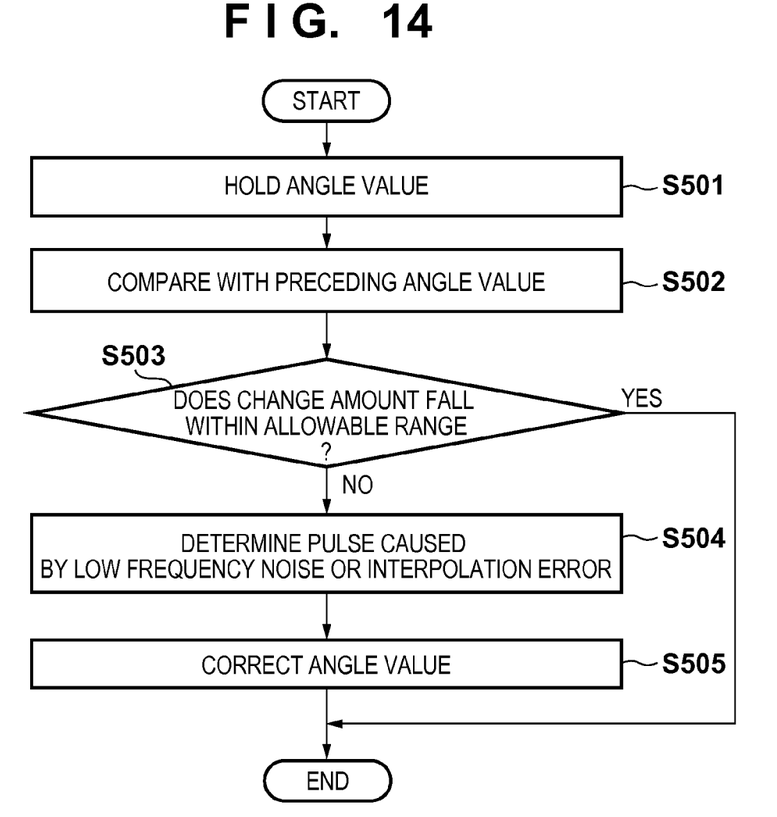
FIG. 14 is a flowchart of angle value correction processing.

FIG. 14 is a flowchart of angle value correction processing by the angle monitor unit 800 and angle correction unit 801. As described above, this processing is executed for an angle value converted by the angle conversion unit 103.

In step S501, the angle monitor unit 800 holds an angle value. Assume that as a buffer required to save an angle value calculated by the angle conversion units 103, a total of two buffers used to save the current angle value and immediately preceding angle value are assured. Note that the number of buffers is not particularly limited, and buffers more than two buffers may be prepared.

In step S502, the angle monitor unit 800 compares angle values. In this case, the angle monitor unit 800 calculates a difference between the current angle value acquired in step S501 and the immediately preceding angle value.

The angle monitor unit 800 judges in step S503 whether or not the difference falls within an allowable range. The allowable range in this case means a range of a difference corresponding to a change generated as a result of an abrupt speed change of the motor, and can be set as, for example, a ratio to an angle change of the angle value ahead of the current angle value of interest. For example, a value (predetermined angle) of ±25% of the angle change of the preceding angle value can be set. However, this ratio can also be arbitrarily set. If it is determined that the difference falls within the allowable range, the processing ends; otherwise, the process advances to step S504.

In step S504, the angle monitor unit 800 determines that an angle change (gap) of the detected angle value is caused by an error due to a distortion of an encode signal. In step S505, the angle correction unit 801 corrects the angle value. As described above, the angle value for which the gap is detected, is replaced by a value obtained by applying the same change amount as the immediately preceding change amount to the immediately preceding angle value.

By correcting an angle value for which a gap falling outside the allowable range is detected in this manner, an angle value in which an interpolation error (and low frequency noise) is removed can be provided to the subsequent dual-phase pulse generation unit 105.

As described above, according to the interpolation apparatus in accordance with one embodiment, a gap of an angle value which is generated when an encode signal including an error caused by a distortion undergoes angle conversion can be corrected. Then, as a result, an interpolation error can be suitably removed.

Other Embodiments

Aspects of the present invention can also be realized by a computer of a system or apparatus (or devices such as a CPU or MPU) that reads out and executes a program recorded on a memory device to perform the functions of the above-described embodiment(s), and by a method, the steps of which are performed by a computer of a system or apparatus by, for example, reading out and executing a program recorded on a memory device to perform the functions of the above-described embodiment(s). For this purpose, the program is provided to the computer for example via a network or from a recording medium of various types serving as the memory device (for example, computer-readable medium).

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2012-137266, filed Jun. 18, 2012, which is hereby incorporated by reference herein in its entirety.

What is claimed is:

1. A signal processing apparatus for processing dual-phase encode signals indicating changes in position of a target, comprising:
a first noise reduction unit configured to remove high frequency noise from each of the dual-phase encode signals before interpolation processing;
an interpolating unit configured to apply interpolation processing to the dual-phase interpolation signals output from said first noise reduction unit to generate dual-phase encode signals with higher resolution; and
a second noise reduction unit configured to remove noise from the dual-phase interpolation signals output from said interpolating unit on the basis of the pulse interval of the dual-phase interpolation signals.

2. The apparatus according to claim 1, wherein said first noise reduction unit applies moving average processing of N stages to each of the dual-phase encode signals.

3. The apparatus according to claim 1, wherein said second noise reduction unit removes the low frequency noise based on a change in the pulse interval.

4. The apparatus according to claim 1, wherein said second noise reduction unit comprises a decision unit configured to decide intervals of neighboring pulses included in the dual-phase interpolation signals.

5. The apparatus according to claim 4, wherein said second noise reduction unit comprises a pulse removing unit configured to remove a pulse having an interval which is decided by said decision unit and is not more than a predetermined interval in association with the dual-phase encode signals.

6. The apparatus according to claim 1, further comprising an analog-to-digital conversion unit configured to convert the dual-phase encode signals into dual-phase digital signals.

7. The apparatus according to claim 1, further comprising a deriving unit configured to derive a moving average value of M stages of intervals of neighboring pulses for each of the dual-phase encode signals,
wherein the predetermined interval is set based on the moving average value of M stages derived by said deriving unit.

8. The apparatus according to claim 4, wherein said first noise reduction unit is a low pass filter.

9. The apparatus according to claim 8, wherein said second noise reduction unit comprises a pulse removing unit configured to remove a pulse having an interval which is decided by said decision unit and is not more than a predetermined interval, and the predetermined interval is set based on a cutoff frequency of the low pass filter.

10. The apparatus according to claim 1, wherein the change in position of the target is a phase change of an angle.

11. The apparatus according to claim 1, wherein the change in position of the target is a change in relative position on a line.

12. The apparatus according to claim 1, wherein said interpolating unit comprises:
   a determination unit configured to determine a phase range of the target based on the dual-phase encode signals;
   a relative angle value deriving unit configured to derive a relative angle value in the determined phase range based on an arctangent value of a ratio of the dual-phase encode signals;
   an angle value deriving unit configured to derive an absolute angle value based on the phase range determined by said determination unit and the relative angle value derived by said relative angle value deriving unit; and
   a generation unit configured to generate dual-phase interpolation signals with higher resolution based on the absolute angle value derived by said angle value deriving unit.

13. The apparatus according to claim 12, wherein said interpolating unit further comprises:
   a monitor unit configured to monitor a change in absolute angle value derived by said angle value deriving unit; and
   a correction unit configured to correct an interest absolute angle value when said monitor unit detects an angle change larger than a predetermined angle.

14. The apparatus according to claim 13, wherein the predetermined angle is decided by a change amount with respect to at least one absolute angle value ahead of the interest absolute angle value.

15. The apparatus according to claim 13, wherein said correction unit corrects the interest absolute angle value based on a change amount of the at least one absolute angle value ahead of the interest absolute angle value.

16. A signal processing apparatus for processing dual-phase encode signals indicating changes in position of a target, comprising:
   a first noise reduction unit configured to remove high frequency noise from each of the dual-phase encode signals before interpolation processing;
   an interpolating unit configured to apply interpolation processing to the dual-phase encode signals output from said first noise reduction unit to generate control signals with higher resolution; and
   a second noise reduction unit configured to remove noise from the control signals output from said interpolating unit on the basis of the pulse interval of the control signals.

17. A signal processing method for processing dual-phase encode signals indicating changes in position of a target, comprising:
   removing high frequency noise from each of the dual-phase encode signals before interpolation processing;
   applying interpolation processing to the dual-phase encode signals output in the removing the high frequency noise to generate dual-phase interpolation signals with higher resolution; and
   removing noise from the dual-phase interpolation signals output in the applying the interpolation processing on the basis of the pulse interval of the dual phase interpolation signals.

18. A signal processing method for processing dual-phase encode signals indicating changes in position of a target, comprising:
   removing high frequency noise from each of the dual-phase encode signals before interpolation processing;
   applying interpolation processing to the dual-phase encode signals output in the removing the high frequency noise to generate control signals with higher resolution; and
   removing noise from the control signals output in the applying the interpolation processing on the basis of the pulse interval of the control signals.

* * * * *